United States Patent [19]
Sondermeyer et al.

[11] Patent Number: 5,619,578
[45] Date of Patent: Apr. 8, 1997

[54] MULTI-STAGE SOLID STATE AMPLIFIER THAT EMULATES TUBE DISTORTION

[75] Inventors: Jack C. Sondermeyer; James W. Brown, Sr., Meridian, both of Miss.

[73] Assignee: Peavey Electronics Corporation, Meridian, Miss.

[21] Appl. No.: 299,104

[22] Filed: Sep. 2, 1994

Related U.S. Application Data

[63] Continuation-in-part of Ser. No. 179,546, Jan. 10, 1994.
[51] Int. Cl.⁶ .................................................. H03G 3/00
[52] U.S. Cl. ............................................. 381/61; 381/62
[58] Field of Search .................................. 381/61, 62–65, 381/96, 120, 118

[56] References Cited

U.S. PATENT DOCUMENTS 5,131,044  7/1992  Pritchard .................................. 381/61

*Primary Examiner*—Stephen Brinich
*Attorney, Agent, or Firm*—Watson Cole Stevens Davis, P.L.L.C.

[57] ABSTRACT

A multi-stage solid state amplifier emulates the distortion associated with grid current flow in a multi-stage tube amplifier by means of a clipping device in the circuit between each series connected stage. In a particular embodiment, each stage includes a field effect transistor (FET) and the clipping device is a diode. In another embodiment, each stage includes a Darlington connected pair of transistors. An input diode and a multilevel biasing circuit emulates a tube circuit input.

27 Claims, 4 Drawing Sheets

MULTI-STAGE SOLID STATE AMPLIFIER THAT EMULATES TUBE DISTORTION

RELATED APPLICATION

This application is a Continuation-In-Part of U.S. patent application Ser. No. 08/179,546 filed Jan. 10, 1994.

BACKGROUND OF THE INVENTION

The invention pertains to amplifiers for musical instruments. In particular, the invention pertains to a solid state multi-stage amplifier which has distortion so that it sounds like a tube amplifier when overdriven.

Tube amplifiers are often preferred by musical artists because tubes produce a distorted output sound which is familiar and thought to be most pleasing. Solid state amplifiers are often preferred because they tend to be lighter, and are often less expensive to produce, are more durable and consume less power. It is difficult to make a solid state amplifier produce a distorted sound like a tube amplifier. Also, the supply of tubes available for use in amplifiers has become scarce and more expensive.

A known tube amplifier 10 is shown in FIG. 1. The amplifier is described with exemplary values of the various elements being noted for characterizing the operation of the device. The amplifier 10 illustrated in FIG. 1 is a pre-amplifier comprising four identical tube sections 12, 14, 16 and 18 (e.g., four 12AX7 tube sections), each tube section has a corresponding plate resistor 20 (100K ohm) and a cathode resistor 22 (1.5K ohm). Each cathode resistor 22 is bypassed with a capacitor 24 (2.2 uF). With these plate and cathode resistor values, a typical 12AX7 amplifier tube section will idle at approximately 1 mA of plate current, approximately 1.5 volts at the cathode and about +200 volts at the plate from a +300 volt source. A positive grid swing in excess of 1.5 volts peak will cause the grid to conduct. A normal guitar input is coupled to the grid of the first tube stage 12 by a coupling capacitor 34 and a grid resistor 36. A resistor 38 is coupled to the node between the capacitor 34 and grid resistor 38 and provides a ground reference for the input to tube 12. Feedback capacitor 40 (10 PF) is coupled between the plate and grid of tube 12 and provides some control of high frequency roll-off, known as the Miller effect, which helps to keep the amplifier stable at open input conditions. The signal from the plate of amplifier 12 is coupled to input of amplifier stage 14 via capacitor 42 and grid resistor 44. Resistor 46 provides a ground reference for stage 14. Resistors 44 and 46 act as a voltage divider. The signal from stage 14 is likewise coupled to stage 16 via capacitor 48 and grid resistor 50, with resistor 52 providing a ground reference for the input and voltage division. Finally, the signal from stage 16 is coupled to the stage 18 via capacitor 54, grid resistor 56 and reference resistor 58 to ground also with voltage division. The output of stage 18 is coupled to the output of the pre-amplifier 10 by output capacitor 60.

The coupling capacitor values 42, 48 and 54, as well as the values of the divider resistances 44/46, 50/52 and 56/58 are chosen in a known manner to provide good distorted sound. Typically, with a guitar level input signal applied, the first stage 12 is clean and free of distortion, although with some high level guitars, even this stage clips at times. The first stage output signal level is high enough to cause input clipping at the second stage 14 because the grid of the second stage 14 is driven positive with respect to the cathode and conducts for a substantial portion of the input cycle. Input clipping at stage 14 results in an average negative voltage on the grid, causing the operating point of the second stage 14 to shift dramatically resulting in a significant amount of second harmonic distortion. The signal at the plate of the second stage 14 resembles a square wave with about two-thirds of the period spent in the positive half cycle. The plate of the second stage 14 has a high enough signal level to cause significant input clipping at the third stage 16. Here too, the grid swings positive with respect to the cathode. Thus, input clipping causes the operating point of the third stage 16 to shift. This is repeated yet one more time, resulting in input clipping and operating point shift of the fourth stage 18. The output at the plate of the fourth stage 18 has gone through several different levels of clipping at the input and output and several operating point shifts and is thus rich in harmonics. All of this essentially results in a characteristic sound which is referred to as good tube sound.

In the exemplary pre-amplifier 10 illustrated in FIG. 1, the available peak plate swing in the positive direction for any stage is about 100 volts (i.e., about one-half the plate voltage). Further, each grid conducts at a positive peak swing of about 1.5 volts. The ratio of 100 to 1.5 or 66.7 is a high number, and its value is important to shift the operating point of each stage enough to generate the appropriate amount of second harmonic distortion. The values of divider resistors 44/46, 50/52 and 56/58 are also critical, and are carefully chosen to set just the right amount of input clipping and resulting second harmonic distortion to produce a pleasing sound.

Of note here are two key ingredients in the so called distorted tube sound. First, the tube characteristics themselves with the 100 volt output capability and only a 1.5 volt input clipping capability or level is unique and required for successful generation of the second harmonic distortion, and that so called tube sound. Secondly, the multiplicity of stages is necessary for a sustained distortion sound as the guitar output level drops after being plucked by the musician. Although more or fewer stages may be employed, at least three, and preferably four stages are required to achieve the desired distortion sound sought by most musicians.

There is, therefore, a need for a solid state amplifier which is capable of replacing the various tube stages in a multi-stage pre-amplifier, and which may be overdriven to emulate the tube sound produced by the such known tube amplifiers.

SUMMARY OF THE INVENTION

The invention is based upon the discovery that the distortion associated with the flow of current in the grid of a tube amplifier operated at high input levels is duplicated in a multi-stage solid stage amplifier by means of a clipping device in the coupling circuit between stages.

The invention comprises a multistage solid state amplifier for emulating the distortion associated with a tube pre-amplifier when overdriven. The invention includes a plurality of solid state tandem or series connected amplifier stages having an input circuit and an output circuit. Each downstream stage has its input circuit coupled to the output circuit of an upstream stage. A clipping device such as a diode is coupled in the input circuit between the stages.

In a particular embodiment, each solid state amplifier stage includes a field effect transistor (FET) having its output terminal coupled to the input of the next downstream stage and the diode is located in the input circuit so as to duplicate the desirable input clipping characteristics of a tube amplifier, wherein the ratio of the output capability to the input clipping level between stages is sufficient to result in adequate second harmonic distortion.

In another embodiment, each solid state amplifier stage comprises a transistor. An alternative arrangement employs a Darlington transistor. When separate transistors are Darlington connected, an internal base resistor to ground may be employed to improve turn-off characteristics of each stage.

In yet another embodiment, an input diode is employed with a multilevel bias circuit to duplicate the input characteristics of a tube amplifier.

DESCRIPTION OF THE INVENTION

Figure 1:
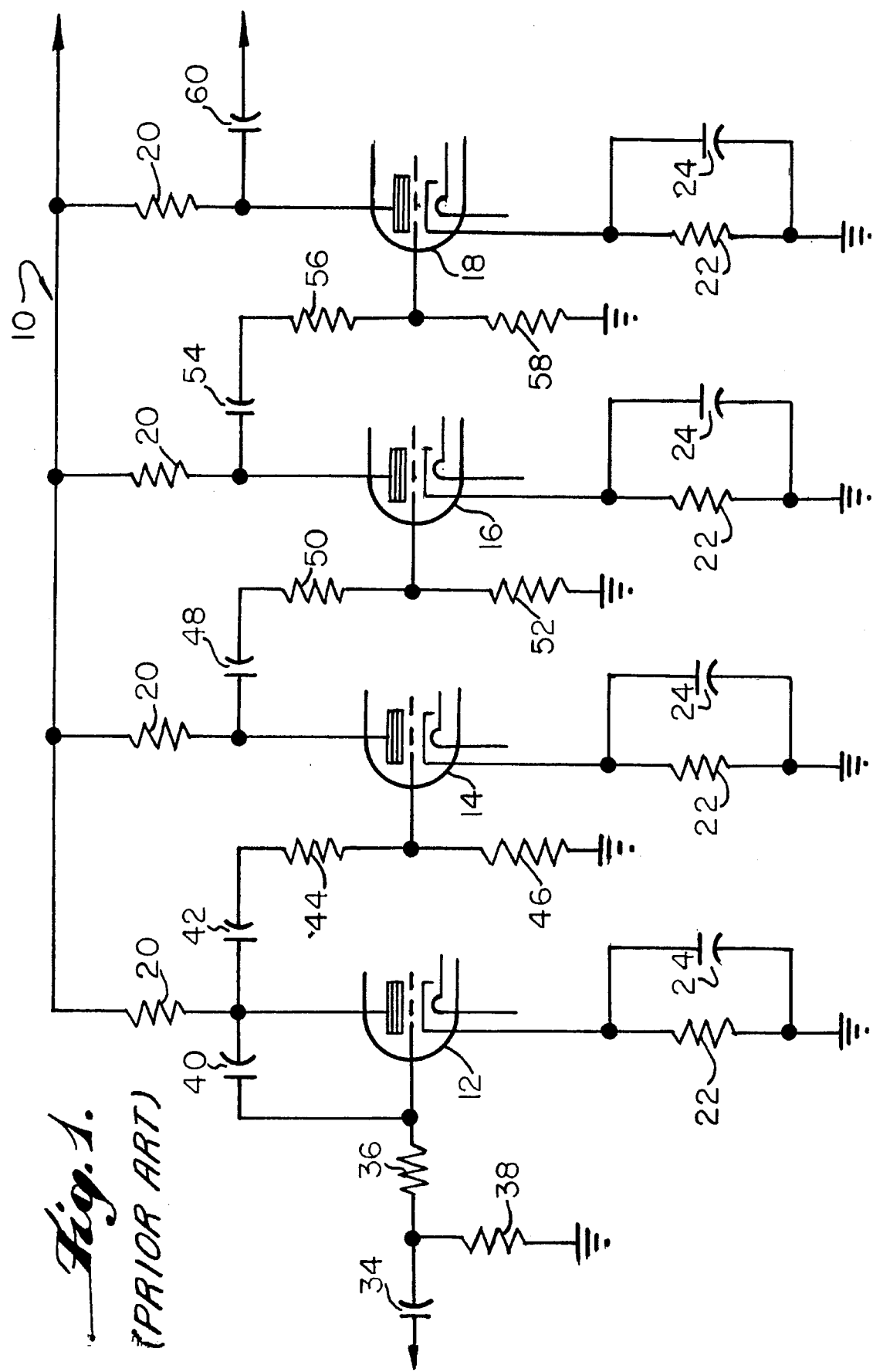
FIG. 1 is a schematic illustration of a known vacuum tube amplifier which exhibits a desirable distorted output.
Figure 2:
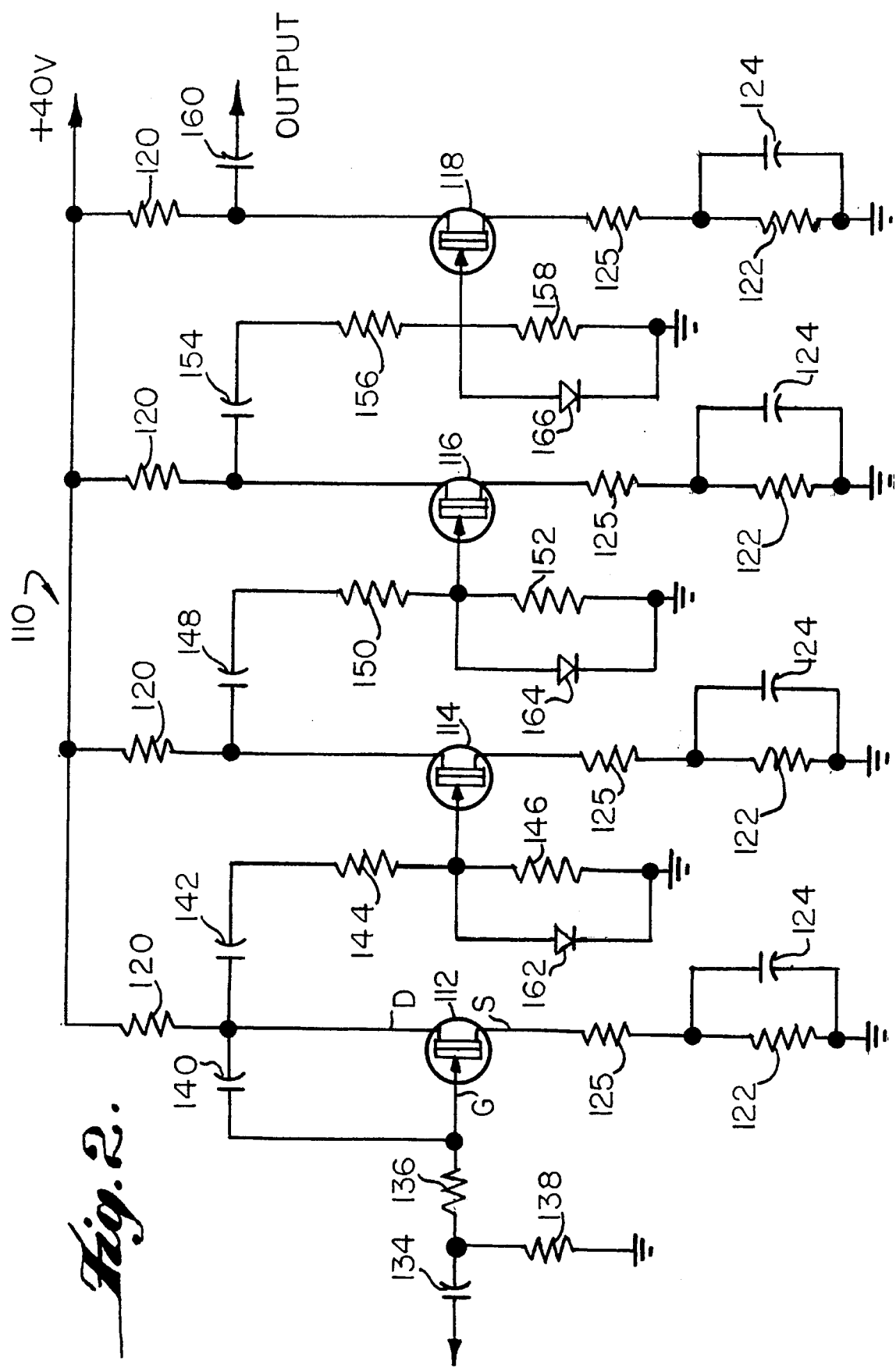
FIG. 2 is a schematic illustration of a multi-stage solid state amplifier according to the invention, employing FET devices, which emulates the distortion and sound produced by known tube amplifiers.

The present invention as illustrated in FIG. 2, is directed to a solid state multi-stage amplifier 110 which uses components arranged in a manner similar to the known device of FIG. 1. In FIG. 2, the components are numbered with reference numerals which correspond to the reference numerals of FIG. 1 in a 100 series, and the tube sections of the known device have been replaced with four solid state amplifier stages 112, 114, 116 and 118. The devices illustrated are field effect transistors (FET) sometimes referred to as J-FET devices, which are supplied by a 40 volt supply. Each amplifier 112–118 has a source S, a drain D and a gate G terminal as illustrated. The drain D corresponds to the output of the device, and the gate G corresponds to the input of the device. Each stage 112–118 includes a drain resistor 120 similar in value to the plate resistor in FIG. 1 (100K ohm). In addition, each stage employs a bias circuit including a resistor 122 (33K ohm) and a bypass capacitor 124 (2.2 uF) in parallel. The source S is coupled through the source resistor 125 and the bias circuit to ground in a self biasing configuration, as shown. In addition, each source S has a source resistor 125 (1K ohm) to set the gain nominally at 100, which is similar to most tube stages. The drain and source resistor values are adjusted so that each FET stage 112, 114, 116 and 118 with a pinch-off voltage of approximately 6 volts will idle at approximately 180 uA of source current. Each will have approximately +22 volts at the drain D and approximately +6 volts at the source S.

In FIG. 2, the drain D, or output, of stage 112 is coupled to the gate G, or input, of stage 114 by coupling capacitor 142 and gate resistor 144. Resistor 146 provides a ground reference to the gate G of stage 114. Also, resistors 144 and 146 act as a voltage divider. Similarly, as in FIG. 1, the successive stages 116 and 117 are coupled by a corresponding combination of a coupling capacitor, gate resistor and reference resistor 148, 150 and 152 and 154, 156 and 158 respectively. The final stage 118 is coupled to the output by means of coupling capacitor 160. The input stage 112 has a Miller capacitor 140 between drain D and the gate G, as illustrated.

In FIG. 2, without the clipping means, the available peak drain signal output capability or swing in the positive direction for any stage is about 18 volts, i.e., the difference between the drain D and the source S. In each amplifier stage 112–118, the gate G operates as a diode which conducts at a positive peak of about 7 volts. Thus, the ratio of the drain output capability (18 volts) and the gate swing (7 volts) is about 2.57. This ratio is insufficient to cause adequate second harmonic distortion.

In the present invention, clipping means is provided between the stages. In the embodiment disclosed, clipping may be achieved by means of diodes 162, 164 and 166 provided in parallel with the corresponding reference resistors 146, 152 and 158 in each of the respective stages 114, 116 and 118. Each diode 162, 164 and 166 has its cathode coupled to ground and its anode coupled to a node between the divider resistors 144/146, 150/152 and 156/158 of each stage. Each diode 162, 164 and 166 conducts in the forward direction and thereby establishes a clipping level at approximately +0.5 volts change in gate swing to emulate distortion associated with grid conduction in a tube amplifier. The ratio of the drain signal output capability or swing (+18 V) to the gate clipping level (+0.5 V) is 18/0.5=36, which is not as high as a tube circuit. However, while a higher ratio is desirable, in a solid state circuit, a ratio of about 30 is sufficient to cause adequate second harmonic distortion in each stage. Accordingly, the solid state, multi-stage preamplifier 110 of the invention produces distortion performance which is quite similar to that of the tube circuit in FIG. 1 by employing a low level input clipping means, such as diodes 162, 164 and 166.

It should be understood that other solid state devices may be employed other than the J-FET type devices and the diode illustrated. Also, gain, coupling and high-frequency characteristics may be tailored by changing the various element values. However, the clipping means provided between stages is effective to produce the operating second harmonic distortion which causes tubelike sound from a solid state amplifier.

Figure 3:
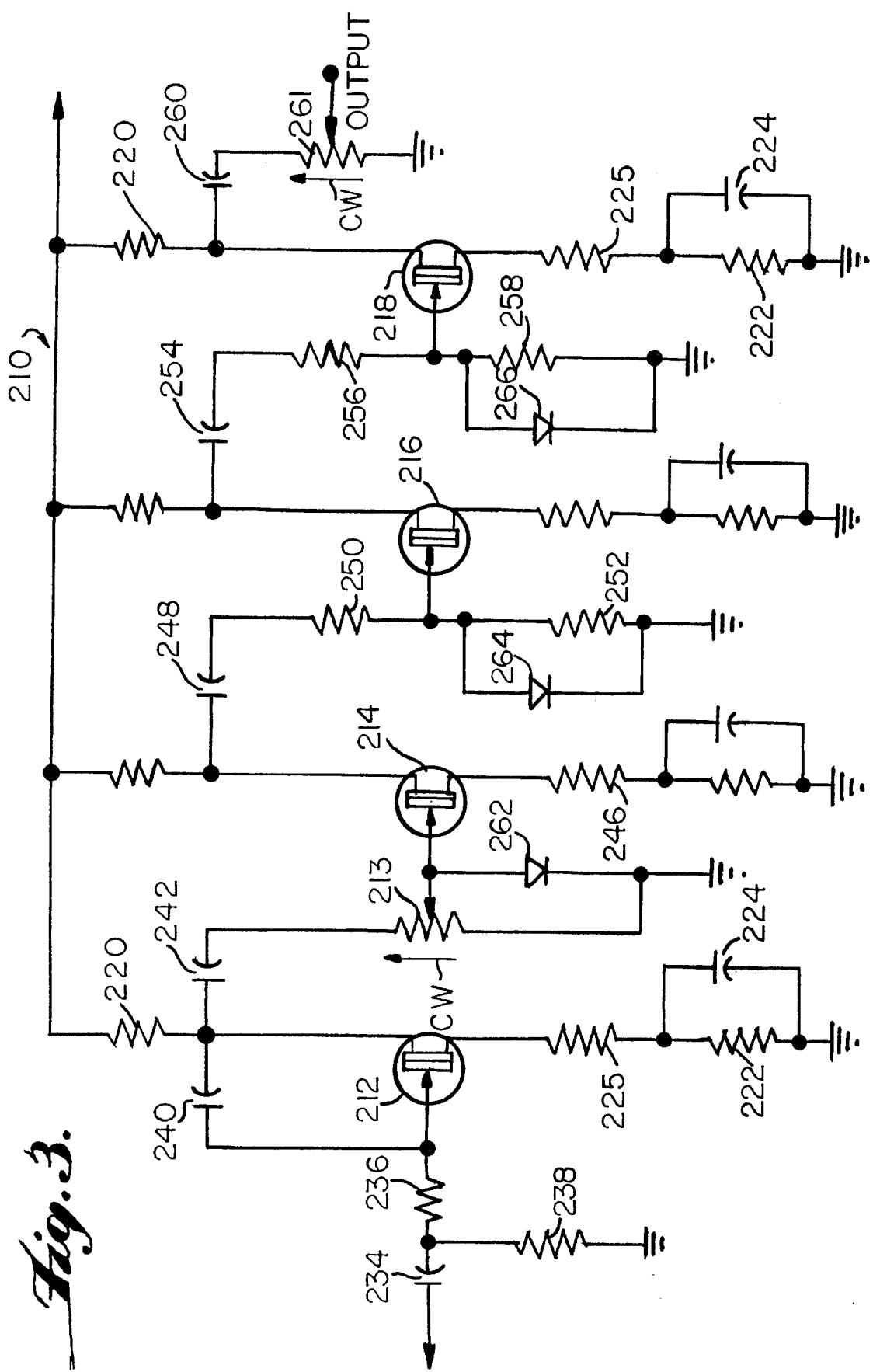
FIG. 3 is a schematic illustration of a particular embodiment of a multi-stage solid stage application according to the invention.

FIG. 3 is an illustration of another embodiment of a multi-stage, solid state 210 amplifier according to the invention. Similar elements have similar reference numbers as shown in FIG. 2 in a 200 series. In FIG. 3, however, a potentiometer 213 is substituted for the fixed divider resistors 144 and 146 between stages 112 and 114. The wiper is coupled to the input of stage 214 and the potentiometer 213 allows maximum distortion in the CW direction where the maximum signal is applied to stage 214.

At the output, a potentiometer 261 is coupled to the coupling capacitor 260. The wiper acts as the output terminal. The output level is maximum when the wiper is in the full CW position. The ability to independently vary the distortion and to vary the level adds versatility to the circuit and allows the artist to tailor the distorted sound and volume at will.

Figure 4:
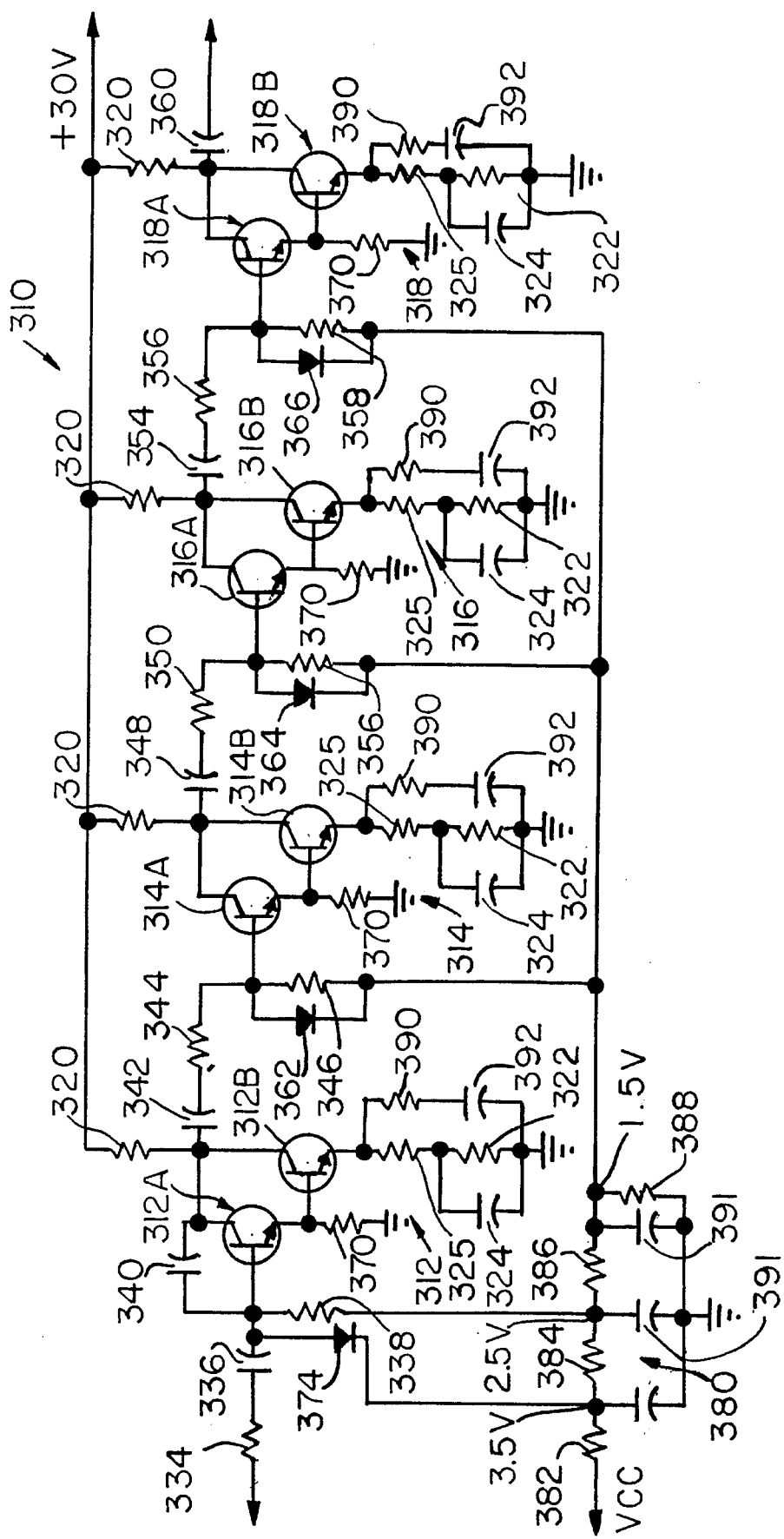
FIG. 4 is a schematic illustration of another embodiment of the invention similar to the arrangement of FIG. 2 wherein each FET is replaced by a Darlington connected pair of transistors and a bias circuit with multiple biasing levels along with an input diode.

FIG. 4 is an illustration of another embodiment of a multi-stage, solid state 310 amplifier having stages 312, 314, 316 and 318 according to the invention. Similar elements have similar reference numbers as shown in FIG. 2 in a 300 series. In FIG. 4, however, a pair of Darlington connected transistors 312A–312B, 314A–314B, 316A–316B and 318A–318B is substituted for each corresponding FET 112, 114, 116 and 118. A multilevel biasing system with an input diode 374 is also provided. An internal base resistor 370 for each stage may be employed for favorably affecting the turn-off characteristics.

In FIG. 4, the circuit function is similar to that of FIG. 2. However, the use of the Darlington connected transistors allows cost and performance advantages. The FET devices described above require a tight pinch-off voltage limit which increases the price considerably. For the transistor devices, the input essentially looks like two diodes which is predictable in terms of performance.

The amplifier 310 of FIG. 4 uses a pair of NPN type Darlington connected transistors 312A–312B, 314A–314B, 316A–316B and 318A–318B for each stage. The NPN type is chosen because the supply is a positive 40 V. A negative supply would allow an opposite device type. Alternatively, a single transistor would operate in the embodiment discussed herein. However, a single transistor would not offer a gain or input impedance to match that of the tube or the FET. Thus, paired transistors are preferred. An integrated Darlington NPN transistor may also be used. However, the discrete transistors offer slightly better performance at high frequencies, because access to the internal base connection is available. In addition, discrete transistors cost less.

The design of FIG. 4 requires a circuit arrangement to bias the transistors. Accordingly, a separate bias supply VCC is provided. The bias voltage for the first stage 312 is adjusted to a first level and a common bias voltage is used for the remaining three stages 314–318. In the exemplary embodiment, all stages 312–318 employ respective 470K bias supply resistors 338, 346, 356 and 358 and 150K collector resistors 320. Each inter-stage has a corresponding input diode 362, 364, 366 to cause the operating point shift therein. Further, each stage has a 470K base resistor 370 from the available internal base to ground in the base emitter circuit between the transistors to improve the turn-off characteristics. The input stage 312 has an input diode 374 for better tube input circuit emulation as discussed hereinafter.

Many of the newer or more contemporary guitars provide a relatively high output voltage, e.g., 3–5 V. It is thus important to have good preamp input overload. Accordingly, the first stage 312 has been biased to duplicate the input overload of a typical 12AX7 tube grid by providing a multilevel bias arrangement.

In the arrangement, bias circuit 380 includes a divider network including resistors 382, 384, 386 and 388 and filter capacitors 391. Resistor 382 is coupled to the anode of input diode 374 and establishes a diode bias level (e.g., 3.5 V DC) for stage 312. Resistor 384 is coupled to the base resistor 338 for establishing the base bias of stage 312 (e.g., 2.5 V DC). Resistor 386 and diode resistor 388 establish a common bias voltage for the downstream stages 314–318, as shown (e.g., 1.5 V DC).

As noted in the exemplary embodiment, VCC is divided to establish a 2.5 volt base bias supply, a 3.5 volt diode supply and a common 1.5 volt supply. In each of the stages 314–318, the corresponding clipping diode 362, 364, 366 is also connected to the common 1.5 volt supply.

In the exemplary embodiment, with the first stage input transistor 312A base is biased at 2.5 volts, the emitter of output transistor 312B finds itself at about 1.5 volts (i.e., two diode drops 0.5 V), which is the same value as the cathode in the previously described tube circuit (FIG. 1). This means that a negative peak swing of 1.5 volts at the input of this stage 312 will cause the operating collector current to go to zero (negative clipping). Such is also the case for that of the tube circuit of FIG. 1. Thus, the circuit of FIG. 4 looks like a tube circuit input.

The first stage input diode 374, conducts at 0.5 V. The 3.5 volt supply, is 1 volt greater than the base supply voltage. The sum of the diode bias voltage of 3.5 V plus the diode drop of 0.5 V equals 4 V which is 1.5 V above the base bias voltage of 2.5 V. This means that a positive peak of 1.5 volts at the input of this stage will cause the input diode 374 to conduct and force an operating point shift (positive clipping). This is also the case for that of the tube circuit. Thus, the circuit of FIG. 4 matches the input dynamic range of the tube circuit.

As noted in FIG. 2, capacitor 340 provides some controlled high frequency roll-off (Miller effect), and the emitter of 312B has series resistors 322 and 325 to ground, with resistor 322 bypassed with capacitor 324. This circuit arrangement provides idle current and gain values to cause overload conditions that match a typical tube first stage. A series circuit, including a resistor 390 and capacitor 392 is coupled across the emitter circuit to achieve a high frequency boost.

The first stage output signal is coupled to the input of the second stage 314 through capacitor 342 and resistor 344 in a way similar to the arrangement of FIG. 2. The remaining three stages 314, 316 and 318 are similar, although component values may change to achieve the desired amount of clipping, operating point shift and frequency response to produce a pleasing overload sound. For example, inter-stage coupling is provided by capacitors 342, 348 and 354 and resistors 344, 350 and 356. In each downstream stage 314–318, the emitters have dual series resistors 322–325 to ground and the ground resistor 322 is bypassed with capacitor 324. Also, each stage employs series resistors 390 and capacitors 392 to ground to provide high frequency boost. The output is delivered via capacitor 360.

The available peak collector swing in the positive direction for any stage is about 20 volts. Each of the three inter-stage clipping diodes 362, 364 and 366 conducts in the forward direction at approximately 0.5 volts. Thus, the ratio of input swing to clipping voltage 20/0.5=40 is adequate to cause the operating point shift of each stage, and the distortion performance is very similar to that of a tube circuit.

It should be understood that the input diode 374 may be employed with an appropriate bias circuit in the arrangement of FIGS. 2 or 3. This circuit allows the circuit to have the same input characteristics as a tube circuit.

In the arrangement of FIG. 4, a volume potentiometer similar to the potentiometer 213 may be inserted in the circuit after capacitor 342, and a master volume potentiometer similar to the potentiometer 261 may be connected after capacitor 360.

It should be noted that this invention is not simply a diode clipping means, and an operating point shifter. Several U.S. patents discuss operating point shift by means of a diode, with resulting second harmonic distortion. The invention shows the important discovery that a diode with a mere 0.5 V forward voltage clipping value, when driven from a typical solid state device with an output capability of about 20 to 30 volts will closely match the particular output/input ratio of the existing tube circuits and therefore closely emulate the tube sound. The present invention also teaches that multiple operating point shifts produced by multiple stages generate a multiplicity of levels and amounts of second harmonic distortion over a wide range input signal levels. The invention further shows a way to duplicate the input overload characteristic of the typical first stage of a tube circuit with a solid state device. The result then, is the so-called tube distortion sound; a sound that can be generated almost exactly with solid state devices.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. A solid state amplifier for emulating the distortion associated with a flow of current in the grid of an overdriven multi-stage tube amplifier at high input signal levels resulting in a desirable input clipping characteristic comprising:

a plurality of series connected solid state devices for amplifying a signal each including an input circuit and an output circuit having an output signal capability, each device downstream of a first one of said devices having its input circuit coupled to the output circuit of one of such devices immediately upstream thereof; and clipping means in the input circuit between each of the devices for establishing a clipping level in one direction between such devices, duplicating in such solid state amplifier the desirable input clipping characteristic of a tube amplifier wherein the output signal capability and the clipping level between stages are in a ratio similar to tube circuits sufficient to result in adequate second harmonic distortion to emulate the distortion effect of a tube amplifier.

2. The amplifier of claim 1 wherein each device comprises a field effect transistor.

3. The amplifier of claim 1 wherein each device comprises a transistor.

4. The amplifier of claim 1 wherein each device comprises a Darlington transistor.

5. The amplifier of claim 4 wherein the Darlington transistor is integrated.

6. The amplifier of claim 4 wherein the Darlington transistor comprises discrete elements.

7. The amplifier of claim 6 wherein the Darlington transistor includes a base-emitter circuit and a bias resistor coupled between the base-emitter circuit and ground.

8. The amplifier of claim 1 wherein the clipping means comprises a diode.

9. The amplifier of claim 8 wherein the output signal capability is effective to forward bias the diode in the input circuit of the device immediately downstream thereof.

10. The amplifier of claim 8 wherein the diode produces forward voltage clipping at about 0.5 V.

11. The amplifier of claim 1 wherein the ratio is at least about 30.

12. The amplifier of claim 1 further including variable input means for at least one of said input circuits for varying the distortion.

13. The amplifier of claim 12 wherein variable input means comprises a potentiometer coupled in output circuit of a first one of said devices, said potentiometer having a wiper coupled to the input of a second one of said devices and the clipping means.

14. The amplifier of claim 1 further comprising variable output means coupled in the output circuit of the last stage for varying an overall output level of the amplifier.

15. The amplifier of claim 14 wherein the variable output means comprises a potentiometer.

16. The amplifier of claim 1 further comprising biasing means for the solid state devices.

17. The amplifier of claim 16 further comprising multi-level biasing means including an upstream biasing means for a first upstream one of the devices and a downstream biasing means for downstream ones of said devices.

18. The amplifier of claim 17 wherein the upstream biasing means comprises a base circuit biasing means coupled to a base element of the upstream solid state device.

19. The amplifier of claim 1 further comprising input diode means coupled between an input of the first upstream stage and a reference.

20. The amplifier of claim 19 further comprising upstream biasing means for the diode.

21. The amplifier of claim 1 further comprising a diode circuit biasing means for establishing a diode circuit bias level, a base circuit biasing means for establishing a base circuit bias level and a downstream biasing means for establishing a downstream bias level and wherein the diode biasing level is greater than the base circuit bias level which in turn is greater than the downstream bias level.

22. The amplifier of claim 1 further comprising means for boosting frequency response at high frequency levels coupled to each device.

23. A solid state amplifier comprising:

a plurality of series connected single ended solid state devices for amplifying a signal each device including an input circuit and an output circuit having an output signal capability, each device located downstream of a first one of said devices having its input circuit coupled to the output circuit of one of said devices located immediately upstream thereof;

a clipper connected in the input circuit of each device downstream of the first one of said devices for clipping signals in one direction above a selected level, and wherein the output signal capability and the input signal level between devices are in a ratio similar to tube circuits sufficient to result in second harmonic distortion.

24. A solid state amplifier comprising:

a plurality of series connected solid state devices each including an input circuit and an output circuit having an output capability, each device downstream of a first one of said devices having its input circuit coupled to the output circuit of one of said devices connected immediately upstream thereof;

a clipper connected to the input circuit of each device downstream of the first one of said devices for establishing a clipping level therefor in one direction; and interstage coupling means for establishing a selected relationship between the output capability of each device and the clipping level similar to tube circuits to emulate the distortion effect of a tube amplifier.

25. A solid state amplifier comprising:

a plurality of series connected Darlington transistors, each Darlington transistor including an input circuit and an output circuit having an output signal capability, each Darlington transistor located downstream of a first one of said Darlington transistor having its input circuit coupled to the output circuit of a Darlington transistor connected immediately upstream thereof; and a clipper in the input circuit of each Darlington transistor downstream of the first one of said Darlington transistor.

26. The amplifier according to the claim 25 wherein the clipping in the input circuit of each Darlington transistor establishes a clipping level between the Darlington transistors, duplicating in such solid state amplifier the input clipping characteristic of a tube amplifier, and the output signal capability and the input clipping level between the Darlington transistors being in a ratio sufficient to result in second harmonic distortion.

27. The amplifier according to claim 25 further including interstage coupling means for establishing a selected relationship between the output capability of each device and the clipping level.

\* \* \* \* \*